United States Patent
Madrigal et al.

(10) Patent No.: US 9,284,644 B2
(45) Date of Patent: Mar. 15, 2016

(54) APPARATUS AND METHOD FOR IMPROVING WAFER UNIFORMITY

(71) Applicant: Lam Research Corporation, Fremont, CA (US)

(72) Inventors: Kevin Madrigal, Santa Cruz, CA (US); Frances Katherine Zelaya, Sunnyvale, CA (US); Hsiang-Yun Lee, Cupertino, CA (US); Kaihan Abidi Ashtiani, Cupertino, CA (US)

(73) Assignee: Lam Research Corporation, Fremont, CA (US)

( * ) Notice: Subject to any disclaimer, the term of this patent is extended or adjusted under 35 U.S.C. 154(b) by 27 days.

(21) Appl. No.: 14/192,525

(22) Filed: Feb. 27, 2014

(65) Prior Publication Data
US 2015/0240361 A1    Aug. 27, 2015

(51) Int. Cl.
| H01L 21/00 | (2006.01) |
| B05C 11/00 | (2006.01) |
| C23C 16/455 | (2006.01) |
| H01L 21/66 | (2006.01) |
| C23C 16/52 | (2006.01) |

(52) U.S. Cl.
CPC ......... *C23C 16/45565* (2013.01); *C23C 16/455* (2013.01); *C23C 16/52* (2013.01); *H01L 22/12* (2013.01)

(58) Field of Classification Search
CPC ..................... H01L 21/02118; H01L 21/3127; B05D 1/60; C23C 16/45563
USPC .............................................. 438/5; 118/692
See application file for complete search history.

(56) References Cited

U.S. PATENT DOCUMENTS

| 6,289,842 | B1 * | 9/2001 | Tompa ..................... 118/723 E |
| 6,534,423 | B1 | 3/2003 | Turner |
| 7,195,934 | B2 * | 3/2007 | Aderhold et al. ............... 438/14 |
| 2005/0109460 | A1 | 5/2005 | DeDontney et al. |
| 2007/0194470 | A1 * | 8/2007 | Dedontney ..................... 261/76 |
| 2008/0202416 | A1 * | 8/2008 | Provencher et al. .......... 118/715 |

OTHER PUBLICATIONS

Ashtiani, K. "SPEED Max HDP CVD"(2008) Novellus Systems Proprietary Information, 13 pages.
Novellus Systems "Defectivity"(2008) Public release material from SEMICON West, 3 pages.

* cited by examiner

*Primary Examiner* — Caridad Everhart
(74) *Attorney, Agent, or Firm* — Weaver Austin Villeneuve & Sampson LLP

(57) ABSTRACT

A semiconductor processing gas flow manifold is provided that allows for the gas flow characteristics of the manifold gas flow paths to be individually adjusted outside of a semiconductor processing chamber. The gas flow manifold may be connected to a process gas dispersion device inside the semiconductor processing chamber. The process gas dispersion device may have multiple gas flow channels, each channel separately connected to a manifold gas flow path and targeted at a region on the semiconductor wafer. The adjustment of the individual manifold gas flow paths may vary the amount of process gas dispersed through each process gas dispersion gas flow channel onto the corresponding region of the semiconductor wafer.

24 Claims, 15 Drawing Sheets

APPARATUS AND METHOD FOR IMPROVING WAFER UNIFORMITY

BACKGROUND

Semiconductor wafer uniformity is an important factor in semiconductor processing. Traditionally, process gas delivery to different areas of the semiconductor wafer processed is not easily adjustable. Semiconductor processing tools are designed to deliver gas symmetrically, but the tools cannot be adjusted to account for asymmetrical variations due to the reactor. The inability to compensate for reactor asymmetry is a limit on the uniformity of processed semiconductor wafers.

SUMMARY

A gas flow manifold and delivery devices for processing gas are provided. The gas flow manifold and delivery devices may be used to adjust gas flow characteristics of semiconductor processing gases without opening a semiconductor processing chamber. Deposition uniformity on a semiconductor substrate may be improved.

In some implementations, a semiconductor processing tool gas flow manifold may be provided. The gas flow manifold may include a semiconductor processing gas flow manifold body and a plurality of manifold gas flow paths extending from a first side of the manifold body to a second side of the manifold body, such that the manifold gas flow paths are individually adjustable from the first side of the manifold body to alter gas flow characteristics through the manifold.

In some such implementations of the manifold, the manifold gas flow paths may be internal to the manifold body.

In some other or additional implementations of the manifold, there may be four manifold gas flow paths.

In some other or additional implementations of the manifold, the gas flow characteristics may be altered by inserting orifices into the manifold gas flow paths. The orifices may include an orifice body and a hole allowing for process gas flow through the hole. In some such implementations, the gas flow characteristics may be altered by removing a first orifice and inserting a second orifice. In some such implementations, the hole of the first orifice may allow a maximum gas flow rate different from the maximum gas flow rate allowed by the hole of the second orifice.

In some other or additional implementations of the manifold, the manifold may further include an injector. The injector may include an injector body and a plurality of injector gas flow paths extending from a first side of the injector body to a second side of the injector body such that each injector gas flow path is fluidically connected with a corresponding manifold gas flow path. In some such implementations, each injector gas flow path may include an inlet and an outlet, wherein the inlet and the outlet are fluidically connected and the inlet and the outlet form an angle between 30 and 60 degrees.

In some other or additional implementations of the manifold, the manifold may further include a showerhead. The showerhead may include a showerhead body and a showerhead faceplate including a plurality of holes, each hole fluidically connected with a manifold gas flow path.

In some other or additional implementations of the manifold, the manifold body may be made of aluminum.

In some implementations, a semiconductor wafer processing tool may be provided. The semiconductor processing tool may include a semiconductor wafer processing chamber, the semiconductor wafer processing chamber including a vacuum sealed chamber interior, and a semiconductor process tool gas flow manifold outside the vacuum sealed chamber interior. The gas flow manifold may include a semiconductor processing gas flow manifold body and a plurality of manifold gas flow paths extending from a first side of the manifold body to a second side of the manifold body, such that the manifold gas flow paths are individually adjustable outside the vacuum sealed chamber interior to alter gas flow characteristics through the manifold. The semiconductor processing tool may also include a process gas dispersion device. The process gas dispersion device may include a first side, the first side fluidically connected with the gas flow paths exiting the second side of the manifold, and a second side, such that the second side is inside the vacuum sealed chamber interior and includes features for emission of process gas into the vacuum sealed chamber interior.

In some such implementations of the semiconductor wafer processing tool, the semiconductor processing tool may further include a process gas source such that the process gas source is fluidically connected to the plurality of manifold gas flow paths and includes features for providing process gas to the manifold gas flow paths. In some such implementations, the semiconductor wafer processing tool may further include a controller with one or more processors and a memory. The one or more processors, the memory, and the process gas source may be communicatively coupled and the memory may store instructions for controlling the one or more processors to cause the process gas source to provide process gas to the manifold gas flow paths. In some other or additional implementations, the semiconductor wafer processing tool may further include a plurality of side injectors. The side injectors may be fluidically connected to the process gas source, the side injectors may be inside the vacuum sealed chamber interior, the side injectors may include features for emission of process gas into the vacuum sealed chamber interior, and the memory stores instructions for controlling the one or more processors to cause the process gas source to provide process gas to the side injectors.

In some other or additional implementations of the semiconductor processing tool, the semiconductor processing tool may further include a process gas intake. The process gas intake may include an intake body, an intake inlet such that the intake inlet receives process gas, and a plenum. The plenum may be fluidically connected to the intake inlet and the manifold gas flow paths, wherein the plenum comprises features for providing process gas to the manifold gas flow paths.

In some other or additional implementations of the semiconductor processing tool, the vacuum sealed chamber interior may include features for supporting a semiconductor wafer. The semiconductor wafer may include a plurality of wafer regions and the second side of the process gas dispersion device may include features for emission of process gas from a plurality of dispersion regions such that the process gas from each dispersion region is targeted at a wafer region. In some such implementations, each manifold gas flow path may supply process gas to one dispersion region.

In some other or additional implementations of the semiconductor processing tool, the features for emission of process gas may include the exit of a plurality of gas flow paths from the first side of the process gas dispersion device to the second side of the process gas dispersion device.

In some other or additional implementations of the semiconductor processing tool, the second side of the process gas dispersion device may be a showerhead faceplate and the features for emission of process gas may include a plurality of holes in the showerhead faceplate.

In some other or additional implementations of the semiconductor processing tool, the semiconductor processing tool may further include a plurality of side injectors. The side injectors may be inside the vacuum sealed chamber interior and include features for emission of process gas into the vacuum sealed chamber interior.

In some implementations, a method for tuning on-wafer uniformity in semiconductor wafer processing may be provided. The method may include: a) applying process gas to a semiconductor wafer inside a semiconductor processing chamber, wherein process gas enters the semiconductor processing chamber through a plurality of gas flow paths extending from a first side of a manifold body to a second side of the manifold body and the first side of the manifold body is outside the semiconductor processing chamber, b) measuring the uniformity of the semiconductor wafer, and c) adjusting, from the first side of the manifold body, the gas flow characteristics through at least one of the gas flow paths in the manifold.

In some such implementations, the method may further include: d) determining whether the uniformity of the semiconductor wafer exceeds a uniformity threshold. In some such implementations, the uniformity threshold may be a half range percentage of less than 1%.

In some other or additional implementations, the method may further include: e) applying process gas to a second semiconductor wafer inside the semiconductor processing chamber, after c).

In some other or additional implementations, the gas flow characteristic may be adjusted by removing a first orifice from within the gas flow path and inserting a second orifice into the gas flow path.

These and other aspects of the present invention are described and illustrated with reference to several embodiments herein.

DETAILED DESCRIPTION

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale unless specifically indicated as being scaled drawings.

A gas flow manifold, including individually adjustable manifold gas flow paths to allow the alteration of gas flow characteristics of process gas that flow through the manifold, is described. The gas flow manifold may be installed in a semiconductor processing tool. The gas flow manifold may deliver process gas directly into a semiconductor processing chamber, or an injector, a showerhead, or another type of gas delivery apparatus may be attached to the gas flow manifold to aid in the delivery of process gas into the semiconductor processing chamber. The gas flow manifold may aid in the improvement of on-wafer uniformity of the semiconductor wafers processed by the semiconductor processing tool.

It is to be understood that, as used herein, the term "semiconductor wafer" may refer both to wafers that are made of a semiconductor material, e.g., silicon, and wafers that are made of materials that are not generally identified as semiconductors, e.g., epoxy, but that typically have semiconductor materials deposited on them during a semiconductor processing. The apparatuses and methods described in this disclosure may be used in the processing of semiconductor wafers of multiple sizes, including 200-mm, 300 mm, and 450 mm diameter semiconductor wafers.

Wafer uniformity is an important factor in the processing of high quality semiconductor wafers. Process gas distribution has a large effect on the uniformity of processed semiconductor wafers. In semiconductor processing, it may be desirable to adjust the amount of process gas applied to an individual section of the semiconductor wafer without affecting the process gas applied to the rest of the semiconductor wafer. It may also be desirable for an easy and time efficient manner to adjust the amount of process gas applied to an individual section of the semiconductor wafer, such as through adjustment of process gas flow through a manifold located outside of a vacuum sealed chamber interior of the semiconductor processing tool.

Figure 1A:
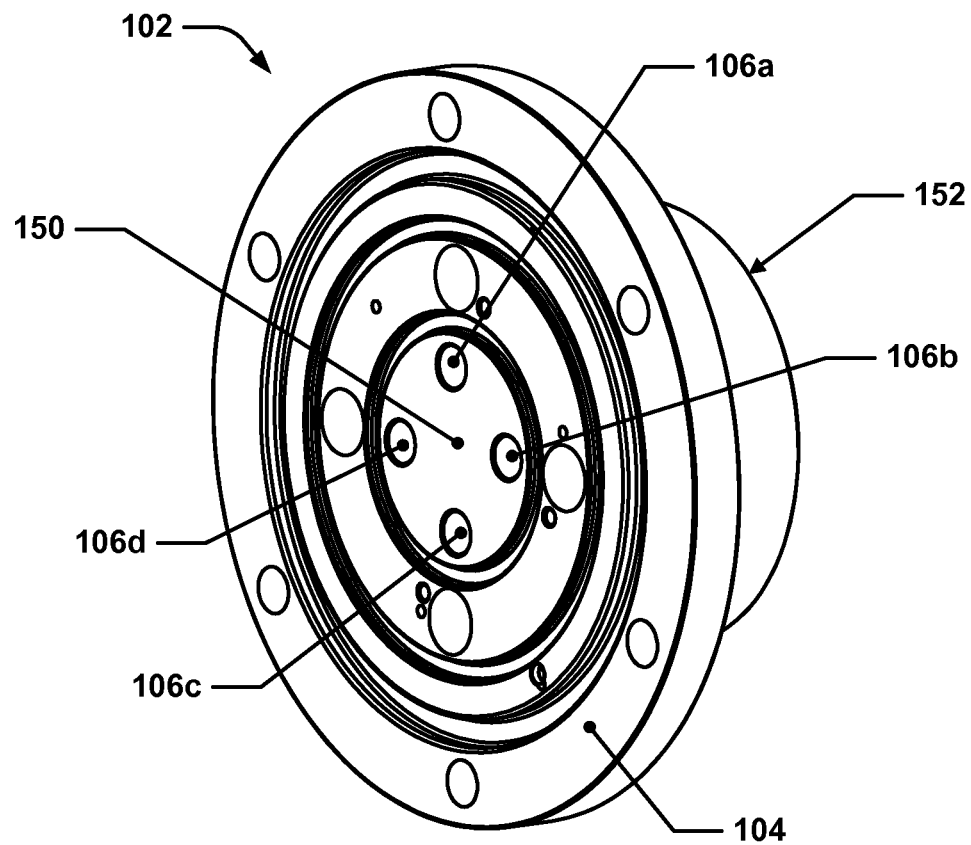
FIG. 1A shows an example of a semiconductor processing tool gas flow manifold.

FIG. 1A shows an example of a semiconductor processing tool gas flow manifold. The implementation of gas flow manifold 102 shown in FIG. 1A includes a gas flow manifold body 104 and manifold gas flow paths 106a-d. Gas flow manifold 102 may be a part of a semiconductor processing tool.

The manifold body 104 may have a variety of different geometries. The manifold body 104 of the implementation shown in FIG. 1A has a cylindrical geometry. Rectangular, triangular, polygonal, oval, or other types of body geometries may also be used. Manifold body 104 may also be constructed from any appropriate material, including aluminum, ceramic, steel, titanium, engineering plastics, or other engineering metals and materials.

In the implementation shown in FIG. 1A, gas flow manifold 102 includes four manifold gas flow paths 106a-d. Other gas flow manifold implementations may vary the number of manifold gas flow paths. In various implementations, there may be any number of manifold gas flow paths.

The gas flow manifold 102 has a first side 150 and a second side 152 (not shown). The manifold gas flow paths 106a-d extend from the first side 150 to the second side 152. In the implementation in FIG. 1A, process gas enters the manifold gas flow paths 106a-d from the first side 150 and exits out the second side 152.

In the implementation in FIG. 1A, the first side 150 and the second side 152 are on opposite ends of gas flow manifold 102 in parallel planes.

In various implementations, the first side 150 and/or the second side 152 may contain features, such as bolt holes, clips, locating features, and attachment features, for the gas flow manifold 102 to interface with other components of a semiconductor processing tool, such as injectors, showerheads, piping, or other components.

Figure 1B:
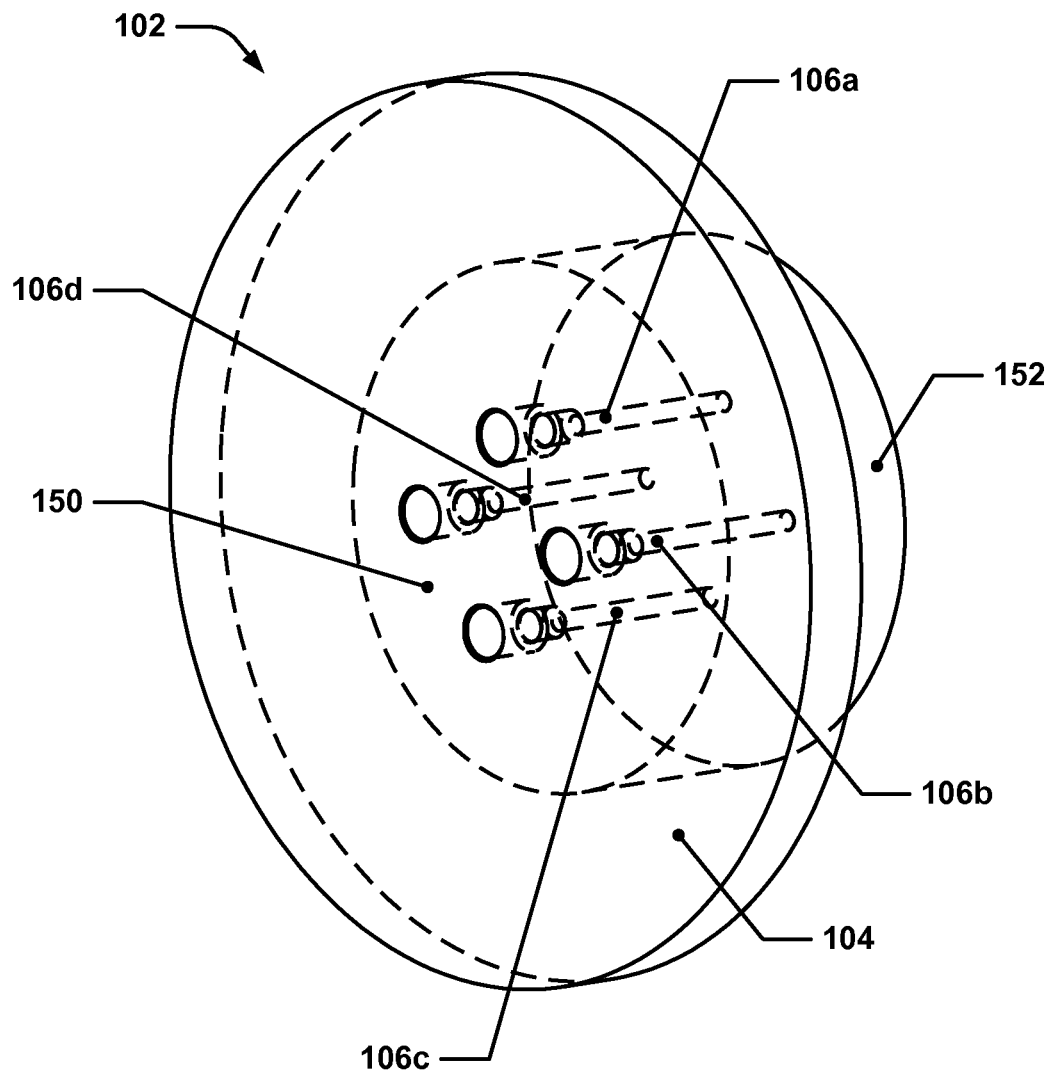
FIG. 1B shows a simplified version of the gas flow manifold of FIG. 1A with the manifold gas flow paths internal to the manifold body highlighted.
Figure 1C:
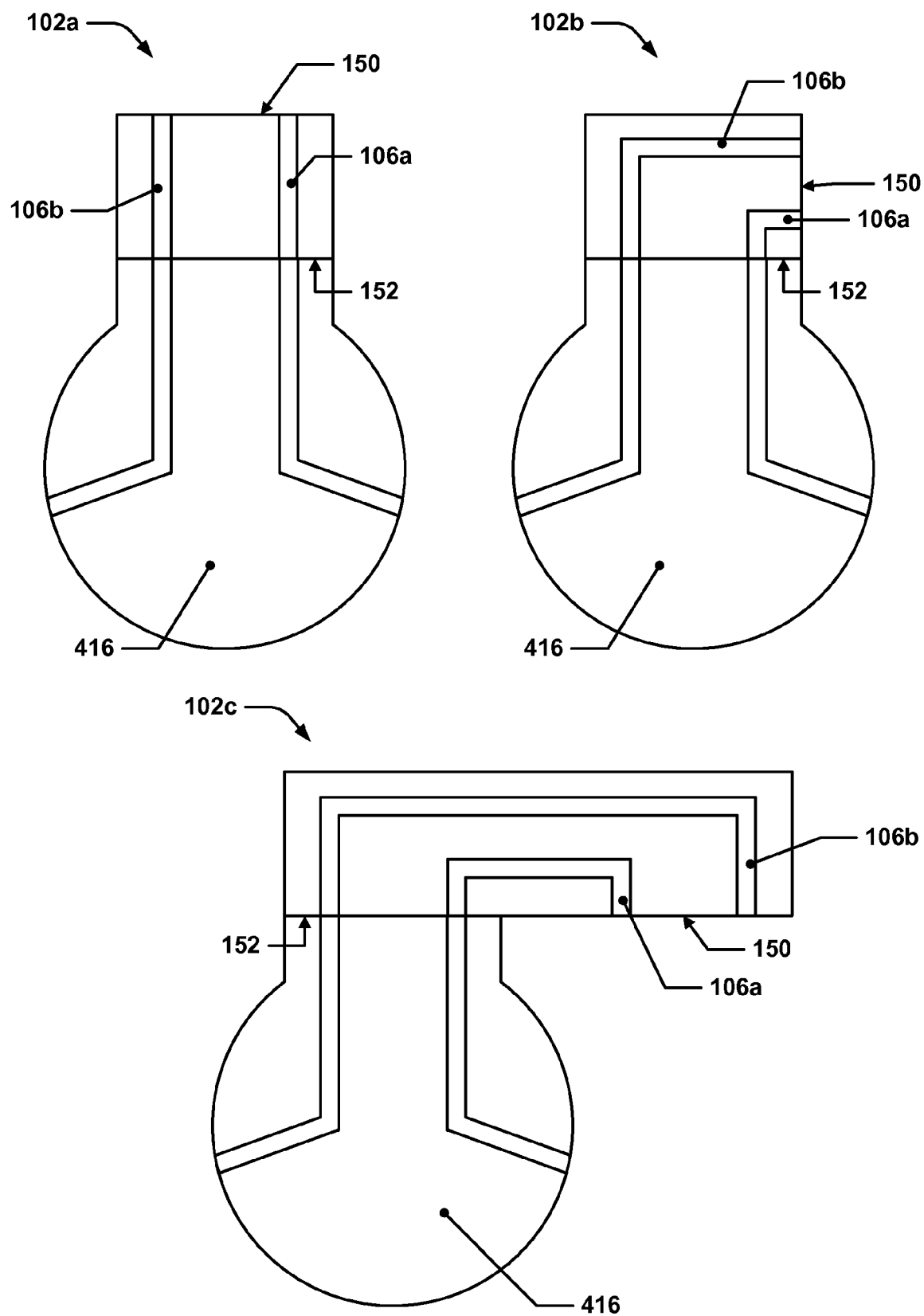
FIG. 1C shows various implementations of example gas flow manifolds with attached injectors highlighting various configurations of manifold gas flow paths.

Other implementations may have the first side and the second side in other configurations, as illustrated in FIG. 1C. FIG. 1C shows various implementations of example gas flow manifolds with attached injectors highlighting various configurations of manifold gas flow paths. Each implementation shown in FIG. 1C has a gas flow manifold and an injector 416. Gas flow manifold 102a is similar to the implementation of the gas flow manifold 102 shown in FIG. 1A. In the gas flow manifold 102a, the first side 150 and the second side 152 are on opposite ends of the gas flow manifold. Gas flow manifold 102b has the first side and the second side on non-parallel planes. Gas flow manifold 102c has the first side and the second side on different areas of the same plane.

FIG. 1B shows a simplified version of the gas flow manifold of FIG. 1A with the manifold gas flow paths internal to the manifold body highlighted. Manifold gas flow paths 106a-d extend from the first side 150 to the second side 152. In the implementation shown in FIG. 1B, the manifold gas flow paths 106a-d are linear gas flow paths. Other implementations may include gas flow paths which are not linear and which may be branching.

Manifold gas flow paths 106a-d may be individually adjustable from the first side of the manifold such that the gas flow characteristics of the manifold may be altered. In this way, the gas flow characteristic of the manifold may be altered without having to open a processing chamber/tool in which the manifold may be installed. In the implementation shown in FIG. 1B, the gas flow characteristics are altered by installing orifices with a variety of hole sizes (not shown, but shown in FIG. 2A) in one or more of the manifold gas flow paths 106a-d. In the implementation in FIG. 1B, manifold gas flow paths 106a-d have larger diameters in the part of the path near the first side 150 and smaller diameters in the part of the path near the second side 152. The larger diameters near the first side 150 is sized to accommodate an orifice which may be installed into the manifold gas flow paths 106a-d. Other implementations may utilize other methods of adjusting gas flow characteristics, e.g., through throttling mechanisms such as through adjustment of the length of manifold gas flow path as well as through mass flow controllers, flow splitters, and upstream orifices.

Figure 2A:
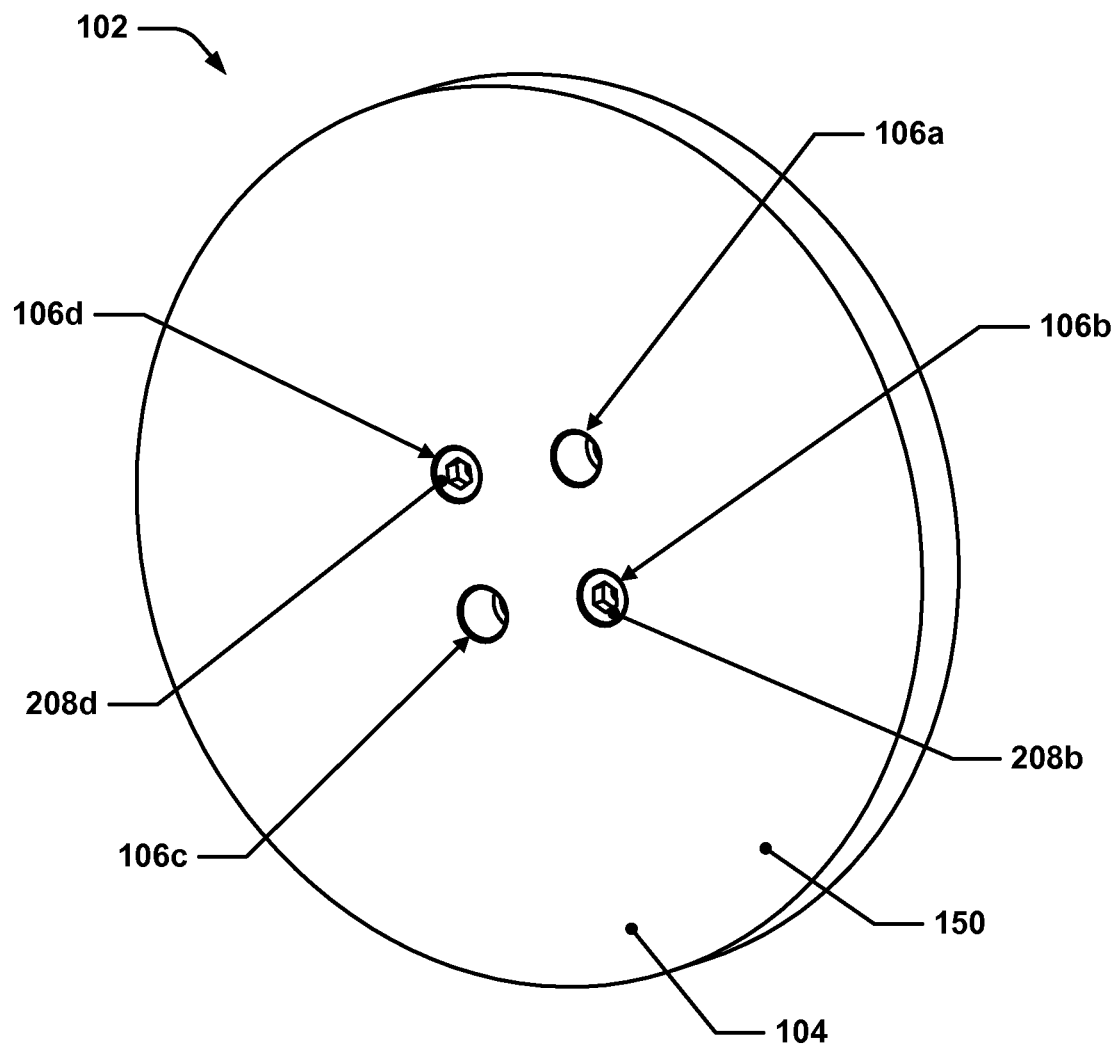
FIG. 2A shows the gas flow manifold of FIG. 1B with orifices installed in two of the manifold gas flow paths.

FIG. 2A shows the gas flow manifold of FIG. 1B with orifices installed in two of the manifold gas flow paths. The gas flow manifold 102 have orifices 208b and 208d installed in manifold gas flow paths 106b and 106d, respectively. Manifold gas flow paths 106a and 106c do not have orifices installed. The manifold gas flow paths 106a-d extend from the first side 150 to the second side (not shown).

In the implementation shown in FIG. 2A, the manifold gas flow paths 106a-d have female threads which accommodate male threads on the outer body of an orifice. Orifices 208b and 208d are threaded into manifold gas flow paths 106b and 106d.

The first side 150 may be outside of a semiconductor processing chamber when the gas flow manifold 102 is installed in a semiconductor processing tool, thus allowing the manifold gas flow paths to be adjusted without accessing the inside of the semiconductor processing chamber. The ability to adjust the manifold gas flow paths of the gas flow manifold without accessing the inside of the semiconductor processing chamber greatly reduces the difficulty in adjusting the gas flow characteristics of the manifold gas flow paths.

Figure 2B:
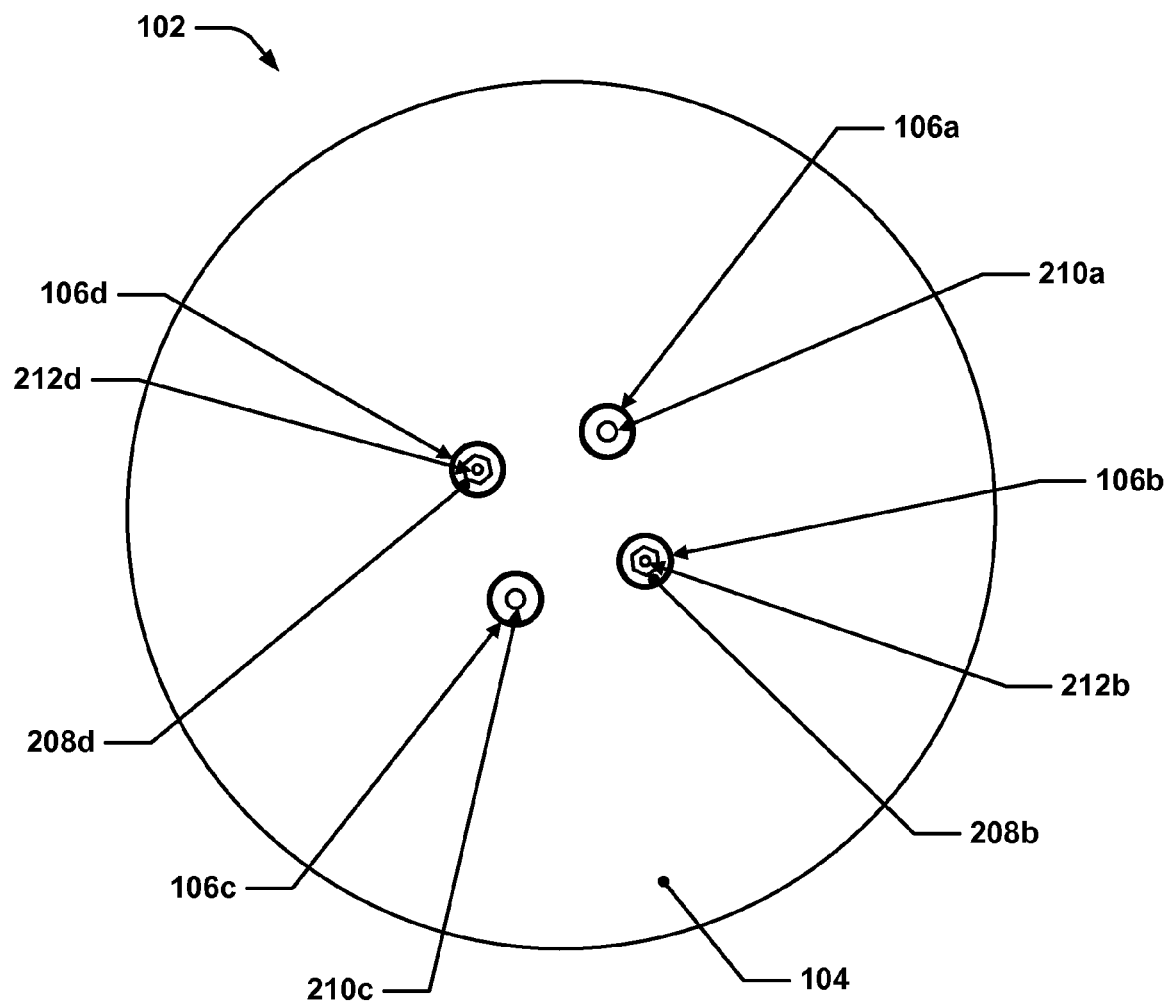
FIG. 2B shows another view of the gas flow manifold in FIG. 2A.

FIG. 2B shows another view of the gas flow manifold in FIG. 2A. Manifold gas flow paths 106a and 106c are at their minimum cross sectional areas at gas flow path openings 210a and 210c. Similarly, manifold gas flow paths 106b and 106d are at their minimum cross sectional areas at orifice openings 212b and 212d. Orifice openings 212b and 212d are the holes of orifices 208b and 208d. The portions where the manifold gas flow paths are at their smallest cross sectional areas are the portions where the flow restrictions are greatest, i.e., where the manifold gas flow paths are "choked." The maximum gas flow rate of a given manifold gas flow path may be adjusted by adjusting the dimensions of the manifold gas flow path's portion where the cross sectional area is smallest, e.g., by inserting an orifice into the manifold gas flow path that has a smaller minimum cross sectional area than that of the manifold gas flow path.

Manifold gas flow paths 106a and 106c, that do not have orifices installed, allow for greater process gas flow than manifold gas flow paths 106b and 106d, that have orifices 208b and 208d installed, respectively. Manifold gas flow paths 106a and 106c allow for greater process gas flow than manifold gas flow paths 106b and 106d due to gas flow path openings 210a and 210c being larger in area than orifice openings 210b and 210d.

The installation of orifices in manifold gas flow paths allow for the adjustment of process gas flow characteristics through the manifold. When less gas flow through a manifold gas flow path is desired, an orifice may be inserted into the manifold gas flow path. By varying which manifold gas flow paths have orifices inserted and also by inserting orifices with varying gas flow path openings, the overall flow of process gas through the manifold as well as the process gas flow through the individual manifold gas flow paths may be adjusted.

Figure 3:
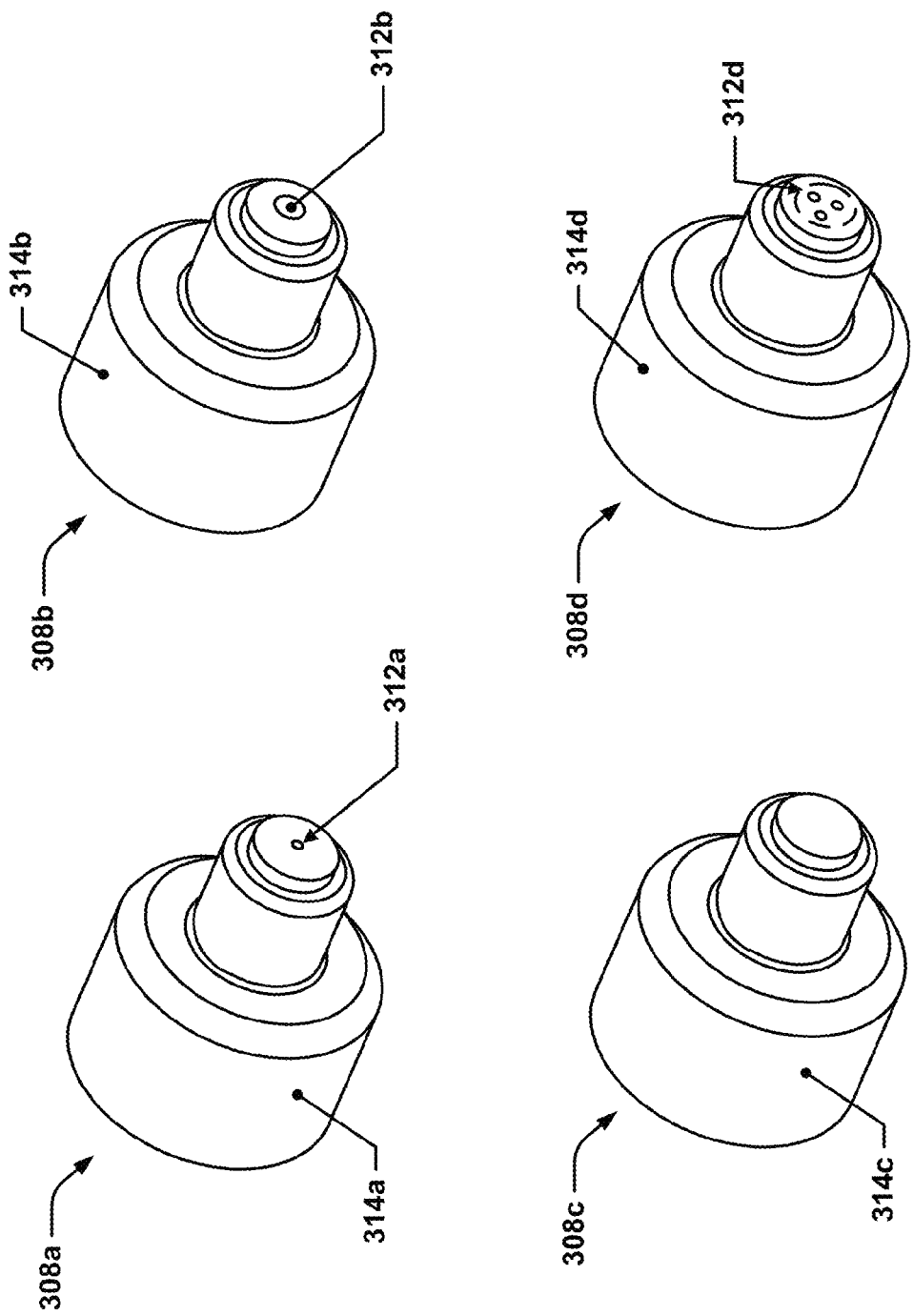
FIG. 3 shows four different example orifices.

FIG. 3 shows four different example orifices. Orifices 308a-d include orifice openings 312a-d and orifice bodies 314a-d, respectively. Each orifice shown in FIG. 3 is configured for a different maximum process gas flow rate when installed in a manifold gas flow path.

Orifice opening 312a of orifice 308a is a small circular opening. Orifice 308a may be inserted into a manifold gas flow path to decrease process gas flow through the manifold gas flow path as typically, when orifice 308a is inserted into the manifold gas flow path, orifice opening 312a becomes the portion of the manifold gas flow path with the minimum cross sectional area.

Orifice opening 312b of orifice 308b is a circular opening larger in diameter than orifice opening 312a. Due to the larger orifice opening, orifice 308b may allow a higher process gas flow rate than orifice 308a. Orifice 308b may replace orifice 308a in a manifold gas flow path in order to raise the maximum process gas flow rate.

Orifice 308c does not have an orifice opening. When inserted into a manifold gas flow path, orifice 308c may block all process gas flow through the manifold gas flow path.

Orifice 308d shows an alternative orifice opening configuration. Orifice opening 312d includes three small circular openings instead of the single circular opening of orifice openings 312a and 312b. Other orifice implementations may have orifice openings in other configurations. For example, the orifice openings may include openings in other geometries, such as oval or square openings and may include any number of openings. The openings may be distributed evenly at one end of the orifice or the distribution may be varied. The openings may also be distributed over more than one planar surface on the orifice. Additionally, the orifice openings of an orifice may be a part of the orifice body, or the orifice openings may be on a separate part and the separate part may be assembled onto the orifice body to create a fully functioning orifice.

Orifices may have features to aid in retention of the orifices by the manifold gas flow paths when the orifices are inserted into the manifold gas flow paths. For example, the orifice body may be threaded to allow the orifice to be screwed into a correspondingly threaded manifold gas flow path.

Figure 4:
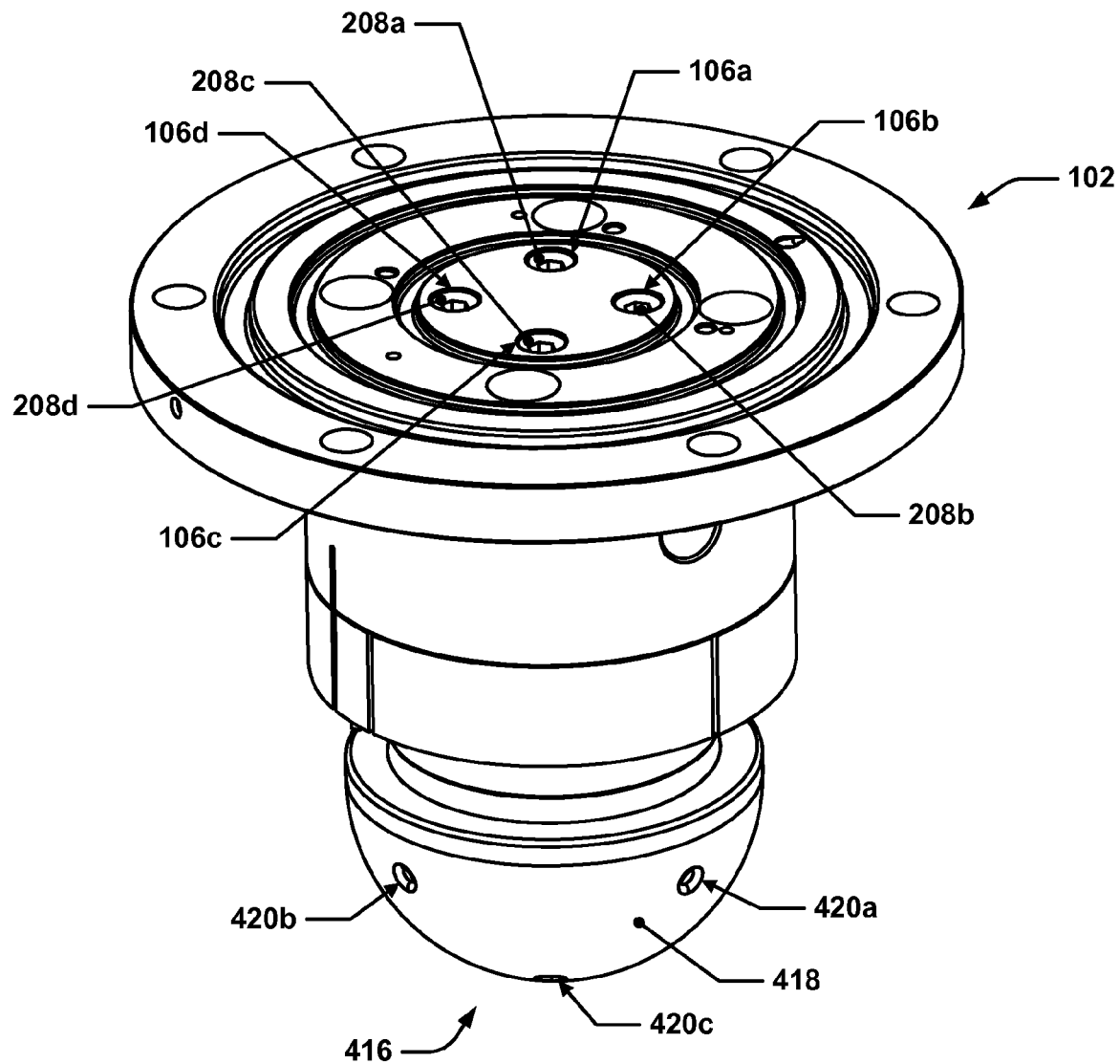
FIG. 4 shows an example of a semiconductor processing tool gas flow manifold assembly including a gas flow manifold, an injector, and orifices.

FIG. 4 shows an example of a semiconductor processing tool gas flow manifold assembly including a gas flow manifold, an injector, and orifices. In FIG. 4, gas flow manifold 102 has four manifold gas flow paths 106a-d. Each of the manifold gas flow paths 106a-d have corresponding orifices 208a-d inserted.

Injector 416 includes an injector body 418 and injector process gas outlets 420a-c. The injector 416 may include additional process gas outlets not shown in FIG. 4. The injector 416 may also include process gas inlets not shown in FIG. 4. The process gas inlets may be arranged to correspond with the manifold gas flow paths of the gas flow manifold such that process gas may flow from the individual manifold gas flow paths through the individual injector gas flow paths into a semiconductor processing chamber.

The injector 416 is installed onto the second side of the gas flow manifold 102. In FIG. 4, the injector 416 is attached to gas flow manifold 102 through bolts holding the injector and the gas flow manifold together. In other implementations, the injector 416 may be attached to the gas flow manifold 102 through a variety of other ways such as quick release fasteners, friction fit, or adhesives.

Figure 5:
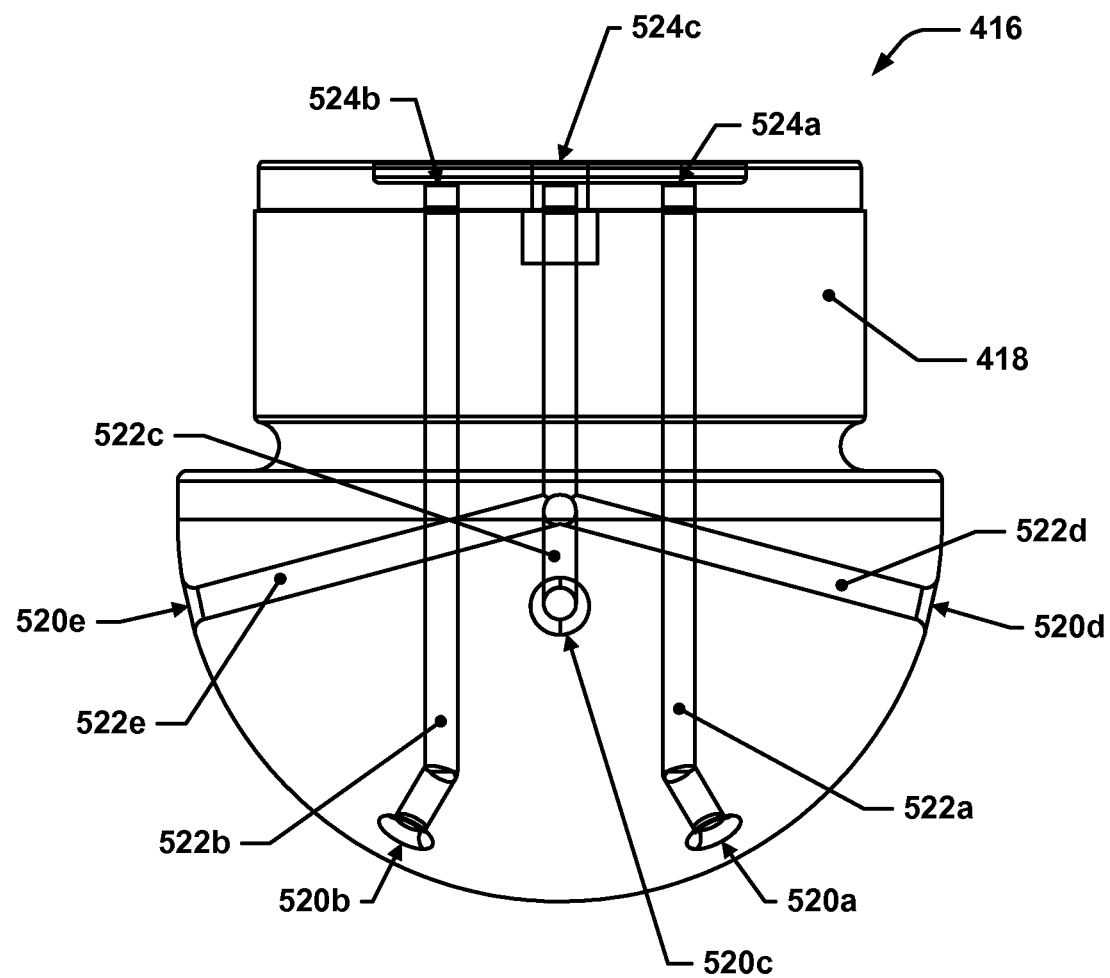
FIG. 5 shows an example injector with the injector gas flow paths internal to the injector highlighted.

FIG. 5 shows an example injector with the injector gas flow paths internal to the injector highlighted. In FIG. 5, the injector 416 includes injector gas flow paths 522a-e as well as additional gas flow paths not shown.

The injector gas flow path 522a is an injector gas flow path with only one inlet and one outlet. The injector gas flow path 522a includes an injector process gas inlet 524a and an injector process gas outlet 520a. The injector process gas inlet 524a may be arranged to correspond with a manifold gas flow path of a gas flow manifold when the injector is installed onto the gas flow manifold. The process gas flow characteristic through the injector gas flow path 522a may be adjusted by inserting an orifice into the corresponding manifold gas flow path.

The injector gas flow path 522a may contain bends between the injector process gas inlet 524a and the injector process gas outlet 520a. In the implementation shown in FIG. 5, the injector gas flow path 522a has one bend. In various implementations, the angle of the bend may be between 30° to 60°, for example, 30°, 40°, 50°, or 60°. Other implementations may have bends with other angles, such as any angle to achieve desired results of semiconductor processing. The bend angle may be determined by the distance between the semiconductor wafer and the injector gas pass outlets. Additional implementations may contain no bends in the injector gas flow path, multiple bends, or bends with different angles.

The configuration of injector gas flow path 522b is similar to the configuration of injector gas flow path 522a.

Injector gas flow paths 522c-e share a common injector process gas inlet 524c with separate injector process gas outlets 520c-e, respectively. Process gas may enter through the injector process gas inlet 524c and then split three-ways between the injector gas flow paths 522c-e. Other implementations may split four-ways or any number of ways to achieve desired results.

In the implementation shown in FIG. 5, the injector gas flow paths 522c-e have equal cross sectional diameters and branch off in equal angles (injector gas flow path 522c branches off towards the viewer) and may thus allow process gas to be distributed in equal volumes to the injector gas flow paths 522c-e. Other implementation may be structured to have an unequal distribution of process gas between the branching injector gas flow paths through differences in bend angles, injector gas flow path lengths, cross sectional diameters, variations in dimensions of the injector gas flow path and/or through restrictions inserted into specific flow paths such as an additional orifice at the injector process gas outlet.

The injector process gas inlet 524c may be arranged to correspond with a manifold gas flow path of a gas flow manifold when the injector is installed onto the gas flow manifold. The process gas flow characteristics through the injector gas flow paths 522c-e may all be adjusted together by inserting an orifice into the corresponding manifold gas flow path.

Figure 6:
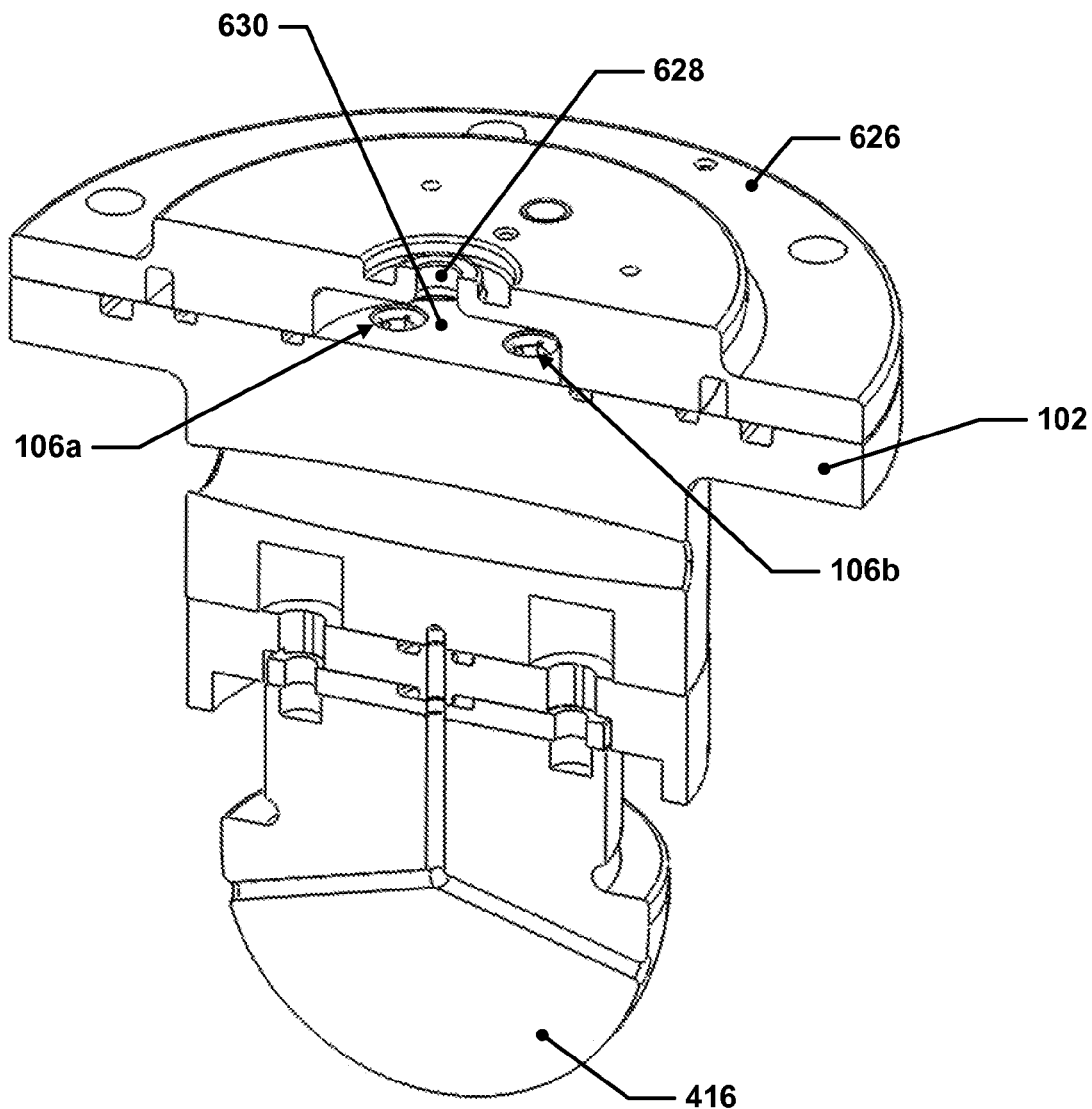
FIG. 6 shows a cutaway of a further example of a semiconductor processing tool gas flow manifold assembly including a gas flow manifold, an injector, a process gas intake, and orifices.

FIG. 6 shows a cutaway of a further example of a semiconductor processing tool gas flow manifold assembly including a gas flow manifold, an injector, a process gas intake, and orifices. The configuration of the gas flow manifold 102 and the injector 416 are similar to the configuration of the gas flow manifold and injector described in FIG. 5.

Process gas intake 626 includes intake inlet 628 and plenum 630. The intake inlet 628 may be connected to a process gas source. When a process gas source is connected, the process gas may enter the plenum 630 through the intake inlet 628. The plenum 630 then distributes process gas to each of the manifold gas flow paths, including manifold gas flow paths 106a and 106b. The plenum 630 may be a chamber which connects to all the manifold gas flow paths of the gas flow manifold 102. In the implementation shown in FIG. 6, the plenum 630 is cylindrical in shape. In other implementations, the plenum may be other geometries.

Figure 7:
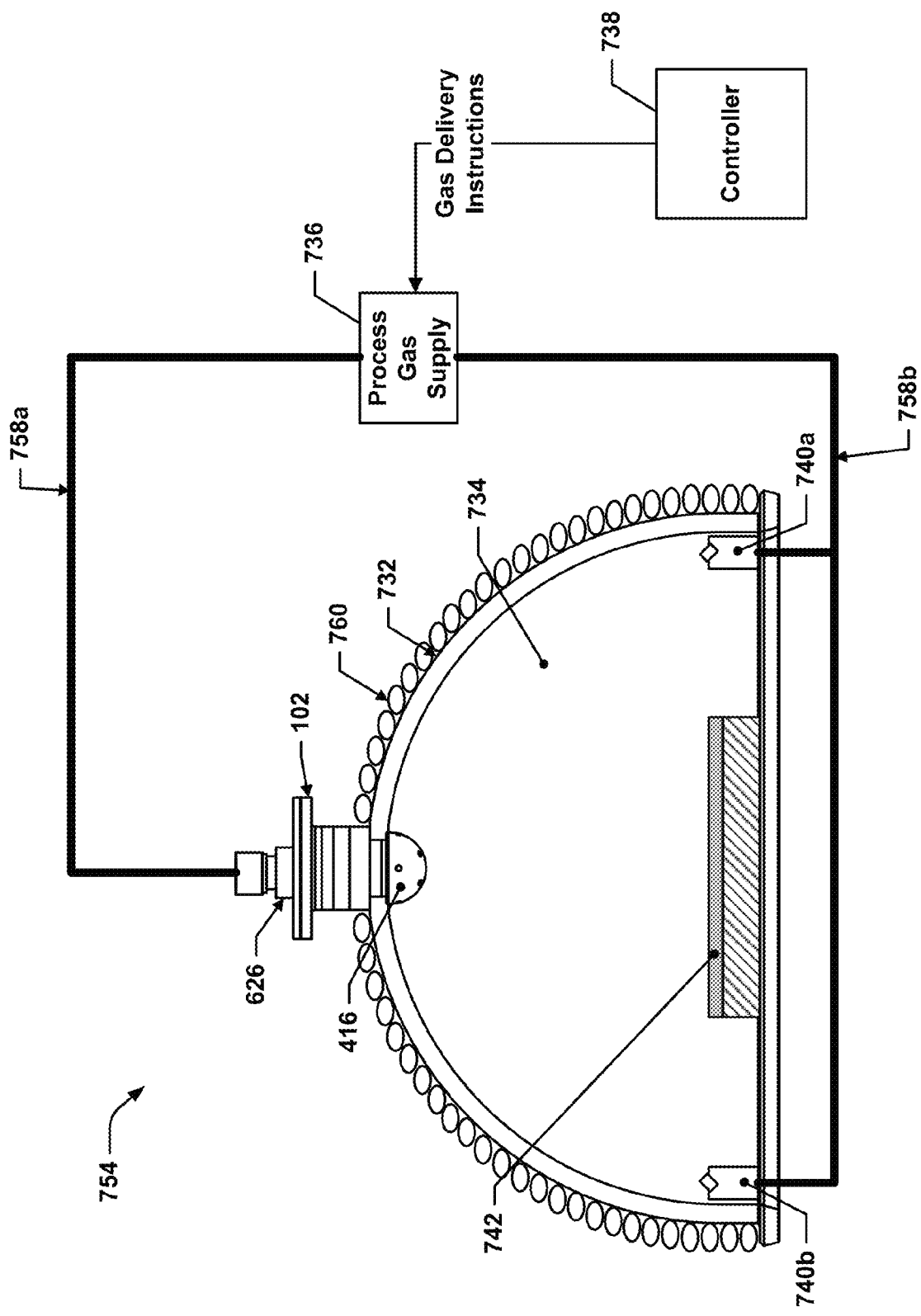
FIG. 7 shows an example semiconductor processing tool with a gas flow manifold and an injector installed.

FIG. 7 shows an example semiconductor processing tool with a gas flow manifold and an injector installed. Injector semiconductor processing tool 754 includes a controller 738, a process gas source 736, process gas delivery paths 758a and 758b, the process gas intake 626, the gas flow manifold 102, the injector 416, RF coils 760, and a semiconductor processing chamber 732 with side injectors 740a and 740b and a semiconductor wafer 742 located inside a vacuum sealed chamber interior 734 of the semiconductor processing chamber 732. The example semiconductor process tool 754 may be a HDP CVD reactor.

The controller 738 may control the process gas source 736, the process gas delivery paths 758a and 758b, the RF coils 760, and other mechanisms of the example semiconductor processing tool. The controller 738 may include one or more physical or logical controllers, one or more memory devices, and one or more processors. The processor may include a central processing unit (CPU) or computer, analog and/or digital input/output connections, stepper motor controller boards, and other like components. Instructions for implementing appropriate control operations may be executed by the processor. These instructions may be stored on the memory devices associated with or part of the controller or they may be provided over a network. In certain implementations, the controller 738 executes system control software or logic.

The system control logic may include instructions for controlling the process gas source, the process gas delivery paths, the RF coils, and any additional mechanisms of the semiconductor tool. The system control logic for controlling the process gas source may include controlling the process gas source to provide process gas, controlling the power provided to the RF coils when process gas is provided, and controlling the operation of any valves or other mechanisms installed in the process gas delivery paths.

System control logic may be provided using various types of technologies, including, but not limited to, the examples discussed herein. For example, in general, the instructions used to control the apparatus may be designed or configured in hardware and/or software. It may be said that the instructions are provided by "programming". The programming may be hard-coded, e.g., in digital signal processors, as part of an application-specific integrated circuit (ASIC), or other devices which have specific algorithms implemented as hardware. In other implementations, programming may be provided as software stored in volatile or non-volatile memory. Programming is also understood to include software or firmware instructions that may be executed on a general purpose processor. System control software may be coded in any suitable computer-readable programming language.

Various subroutines or control objects may be written to control operation of the process gas source, the process gas delivery paths, and the RF coils. In some implementations, system control software may include input/output control (IOC) sequencing instructions for controlling the various parameters described herein.

In some implementations, there may be a user interface associated with the system controller. The user interface may include a display screen, graphical software displays of the apparatus and/or process conditions, and user input devices such as pointing devices, keyboards, touch screens, microphones, etc. Such a user interface may be used, for example, to adjust various parameters that affect system performance, e.g., the timing of when process gas is provided, the operation of any valves or other mechanisms in the process gas delivery paths, and the power provided to the RF coils.

In some implementations, parameters relating to operation conditions may be adjusted by the system controller. Non-limiting examples include the size of the semiconductor wafer, the type of the semiconductor wafer, the process gases provided, and the configuration of the injectors or showerheads, etc.

Signals for monitoring the semiconductor processing tool may be provided by analog and/or digital input connections of the system controller with a sensor or multiple sensors contained within the semiconductor processing tool. The signals for controlling the semiconductor processing tool may be sent by the controller via analog and/or digital output connections.

The process gas source 736 may contain any process gas used in semiconductor wafer processing, including O2, SiH4, H2, He, N2, CH4, C2H2, Ar, PH3, NH3, NF3, and any other type of process gas. The process gas source 736 may contain all of a plurality of process gasses used during a specific semiconductor wafer process.

The process gas delivery path 758a may deliver process gas from the process gas source 736 to the process gas intake 626.

The process gas delivery path 758b may deliver process gas from the process gas source 736 to the side injectors 740a and 740b. The process gas delivery paths may have multiple delivery paths, such as multiple gas delivery lines, in order to keep different types of process gasses separate or to accommodate the required process gas flow rate.

The process gas intake 626, the gas flow manifold 102, and the injector 416 are similar in configuration to those described in FIG. 4-6, respectively. Both the process gas intake 626 and the gas flow manifold 102 are outside the semiconductor processing chamber 732.

In the implementation shown in FIG. 7, the entire gas flow manifold 102 is outside the semiconductor processing chamber 732. The manifold gas flow paths of the gas flow manifold 102 may be adjusted without accessing the inside of the semiconductor processing chamber 732. In other implementations, only the first side of the gas flow manifold, the side where adjustments are made to the manifold gas flow paths of the gas flow manifold, may be outside the semiconductor processing chamber. In those implementations, the manifold gas flow paths of the gas flow manifold may still be adjusted without accessing the inside of the semiconductor processing chamber. The ability to adjust the manifold gas flow paths of the gas flow manifold without accessing the inside of the semiconductor processing chamber reduces the complication, time required, and effort needed to adjust the process gas flow to improve wafer uniformity, thus improving wafer throughput. In addition, the potential for contamination is also reduced.

Gas flow manifold 102 is connected to injector 416. The injector process gas outlets are inside the semiconductor processing chamber 732. Process gas delivered from the process gas source 736 through the process gas delivery path 758a to the process gas intake 626 may then flow through the gas flow manifold 102 to the injector 416 before being introduced by the injector process gas outlets of the injector 416 into the vacuum sealed chamber interior 734.

The side injectors 740a and 740b are also inside the semiconductor processing chamber 732 and may emit process gas. The process gas may be premixed or not. Process gas may be introduced in one step, or in multiple stages. Different process gasses may be introduced at different stages. Different injectors may also introduce process gas at different stages. In the implementation shown in FIG. 7, the process gas emitted by the injector 416 and the side injectors 740a and 740b may target different parts of the semiconductor wafer 742.

As previously described, process gas flow characteristics through the individual manifold gas flow paths may be adjusted. When process gas flow characteristics through the manifold are adjusted, the resulting process gas flow characteristics through the injector gas flow paths connected to the manifold gas flow paths are also affected. By adjusting the process gas flow through individual manifold gas flow paths, a more uniform distribution of process gas onto the semiconductor wafer may be achieved.

The semiconductor processing chamber 732 has a vacuum sealed chamber interior 734. The semiconductor processing chamber 732 may also enclose components not described in FIG. 7 and may serve to contain process gas and/or plasma during semiconductor wafer processing. The implementation shown in FIG. 7 contains the RF coils 760 as a plasma source. The RF coils 760 may be any suitable coil. Examples of suitable reactors include the SPEED™ and SPEED MAX™ reactors available from Lam Research of Fremont, Calif.

Also inside the vacuum sealed chamber interior 734 in the example shown in FIG. 7 is the semiconductor wafer 742. The vacuum sealed chamber interior 734 may house one or more semiconductor wafers for processing. The vacuum sealed chamber interior 734 may maintain the one or more semiconductor wafers in a defined position or positions. When in process, each semiconductor wafer may be held in place by a pedestal, wafer chuck, and/or other wafer holding apparatus. For certain operations in which the wafer is to be heated, the wafer holding apparatus may include a heater such as a heating plate.

The vacuum sealed chamber interior 734 may be maintained at a sub-atmospheric pressure by a vacuum pump or through other techniques. At the conclusion of processing, process gasses may exit the vacuum sealed interior 734 through an outlet.

Figure 8:
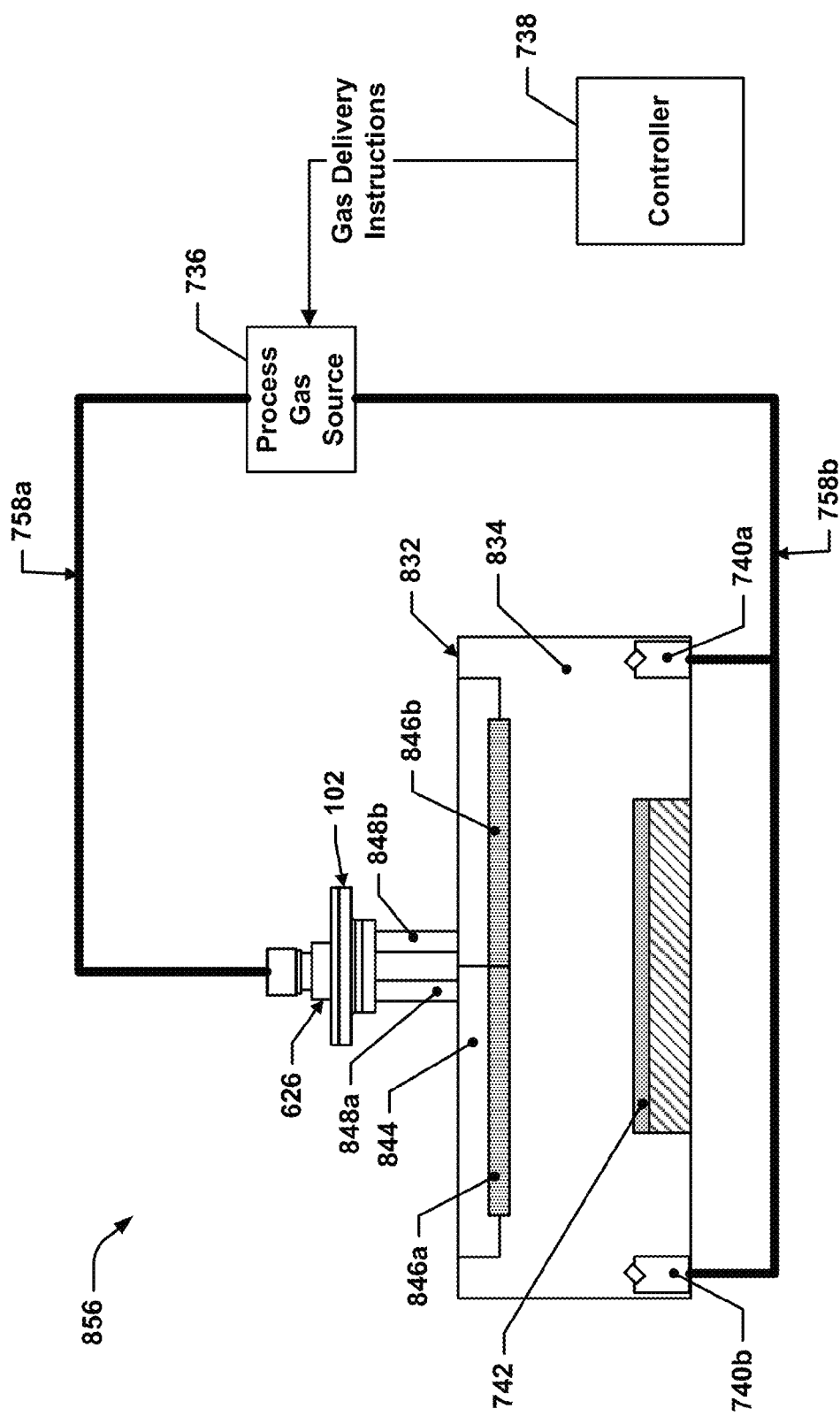
FIG. 8 shows an example semiconductor processing tool with a gas flow manifold and a showerhead installed.

FIG. 8 shows an example semiconductor processing tool with a gas flow manifold and a showerhead installed. Injector semiconductor processing tool 856 includes the controller 738, the process gas source 736, the process gas delivery paths 758a and 758b, the process gas intake 626, the gas flow manifold 102, a showerhead 844 with showerhead inlets 848a and 848b and showerhead faceplate 846a and 846b, and the semiconductor processing chamber 832 with the side injectors 740a and 740b and the semiconductor wafer 742 located inside a vacuum sealed chamber interior 834 of a semiconductor processing chamber 832.

The controller 738, the process gas source 736, the process gas delivery paths 758a and 758b, the process gas intake 626, the side injectors 740a and 740b, and the semiconductor wafer 742 in FIG. 8 are similar to those components described in FIG. 7. The semiconductor wafer 742 may be housed in the semiconductor processing chamber 832 in a similar configuration to that of FIG. 7.

In the implementation shown in FIG. 8, the semiconductor processing chamber 832 is constructed in a different geometry than the semiconductor processing chamber 732 shown in FIG. 7. The semiconductor processing chamber 832 includes the vacuum sealed chamber interior 834, but may lack the RF coils that are attached to the semiconductor processing chamber 732. Suitable tools used in the implementation in FIG. 8 include VECTOR™ and ALTUS™ semiconductor processing tools from Lam Research.

The showerhead 844 may be any type of showerhead appropriate for semiconductor processing and may include showerhead inlets and showerhead faceplates such as showerhead inlets 848a and 848b and showerhead faceplates 846a and 846b.

Gas flow manifold 102 is similar in configuration to the gas flow manifold described in FIG. 7. In the implementation shown in FIG. 8, the gas flow manifold 102 is connected to the showerhead inlets 848a and 848b. The process gas that flows through the gas flow manifold 102 is distributed to the showerhead inlets 848a and 848b. In the implementation shown in FIG. 8, the process gas from the gas flow manifold 102 may be distributed equally between the showerhead inlets 848a and 848b. In other implementations, process gas from the gas flow manifold 102 may be distributed unequally between the showerhead inlets 848a and 848b or there may be more than two showerhead inlets.

The showerhead inlet 848a may receive process gas from separate manifold gas flow paths than the manifold gas flow paths that distribute process gas to the showerhead inlet 848b. Process gas that flows into showerhead inlet 848a is then kept separate from process gas that flows into showerhead inlet 848b until the process gas exits the showerhead 844 from the showerhead faceplate 846a. Process gas that flows into the showerhead inlet 848b exits the showerhead 844 from the showerhead faceplate 846b. Once process gas enters the gas flow manifold 102, it may be separated into independent manifold gas flow paths and may not comingle until exiting the showerhead faceplates 846a and 846b. There may be as many showerhead faceplate sections as needed.

In such a configuration, different sections of the showerhead faceplate may target process gas at different sections of the semiconductor wafer 742. The process gas flow characteristics through each section of the showerhead faceplate may be adjusted by adjusting the gas flow characteristics through the corresponding manifold gas flow paths.

Figure 9:
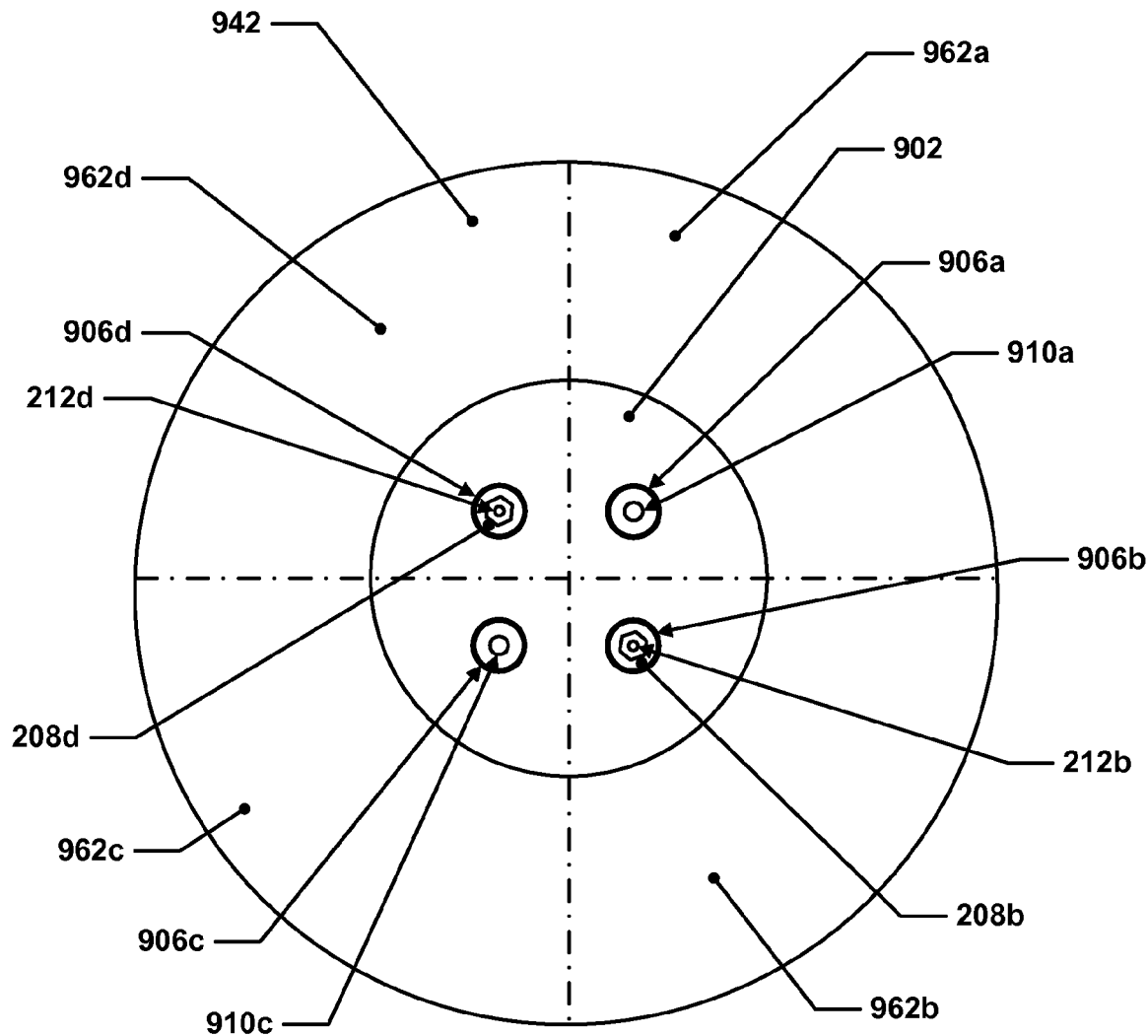
FIG. 9 shows a simplified gas flow manifold and a semiconductor wafer with four semiconductor wafer sections.

FIG. 9 shows a simplified gas flow manifold and a semiconductor wafer with four semiconductor wafer sections.

Gas flow manifold 902 contains four manifold gas flow paths 906a-d. The manifold gas flow paths 906a-d are similar to the manifold gas flow paths of the gas flow manifold in FIG. 2B. The gas flow manifold 902 may have an attached injector not shown in FIG. 9. The injector may feature four injector gas flow paths, each individually connected to a corresponding manifold gas flow paths.

Semiconductor wafer 942 includes four semiconductor wafer sections 962a-d. Each of the four injector gas flow paths may have injector process gas outlets arranged to apply process gas primarily onto a corresponding semiconductor wafer section. The process gas flow characteristics, such as the flow rate of process gas applied to each semiconductor wafer sections, may be adjusted by inserting orifices into the manifold gas flow paths to vary the maximum process gas flow rate. In the example shown in FIG. 9, the manifold gas flow paths 906b and 906d have the orifices 208b and 208d inserted. The insertion of the orifices 208b and 208d may restrict process gas flow through the manifold gas flow paths 906b and 906d. Consequently, the amount of process gas applied to the semiconductor wafer sections 962b and 962d may be less than the amount of process gas applied to the semiconductor wafer sections 962a and 962c.

Figure 10:
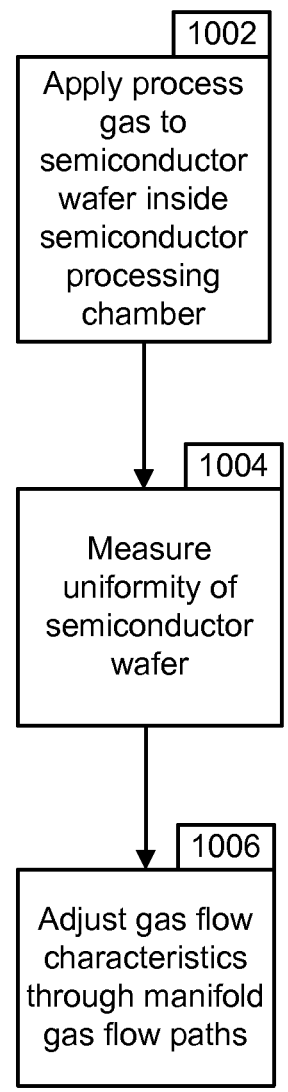
FIG. 10 shows a flow diagram detailing an example of tuning on-wafer uniformity with a gas flow manifold.

FIG. 10 shows a flow diagram detailing an example of tuning on-wafer uniformity with a gas flow manifold.

In block 1002, process gas is applied to a semiconductor wafer inside a semiconductor processing chamber. The semiconductor processing chamber may be similar to the processing chambers described in FIGS. 7 and 8, or it may be a different type of semiconductor processing chamber. The process gas may be applied to the semiconductor wafer by an injector connected to a gas flow manifold. The gas flow manifold and the injector may include multiple gas flow paths which apply process gas onto different sections of the semiconductor wafer.

In block 1004, the uniformity of the semiconductor wafer processed in block 1002 is measured. The uniformity of the semiconductor wafer may be measured as a radial value or typographically. Uniformity may be measured with any equipment appropriate for measuring the uniformity of semiconductor wafers, including KLA Tencor F5 or Therma-Wave Opti-Probe.

In block 1006, the gas flow characteristics through the manifold gas flow paths are adjusted. The gas flow characteristics may be adjusted by inserting orifices into the manifold gas flow paths, or by changing the orifices already inserted for different orifices with different orifice openings. By adjusting the gas flow characteristics, the flow rate of process gas through the various manifold gas flow paths may be adjusted, varying the process gas delivered to different regions of the semiconductor wafer.

The gas flow characteristics may be adjusted through trial and error, such as through experimentation with which orifice hole diameter sizes to use in the gas flow paths, or through adjustments aided by calculations and/or flow modeling to arrive at the orifice hole diameter sizes needed to achieve the desired semiconductor uniformity.

Figure 11:
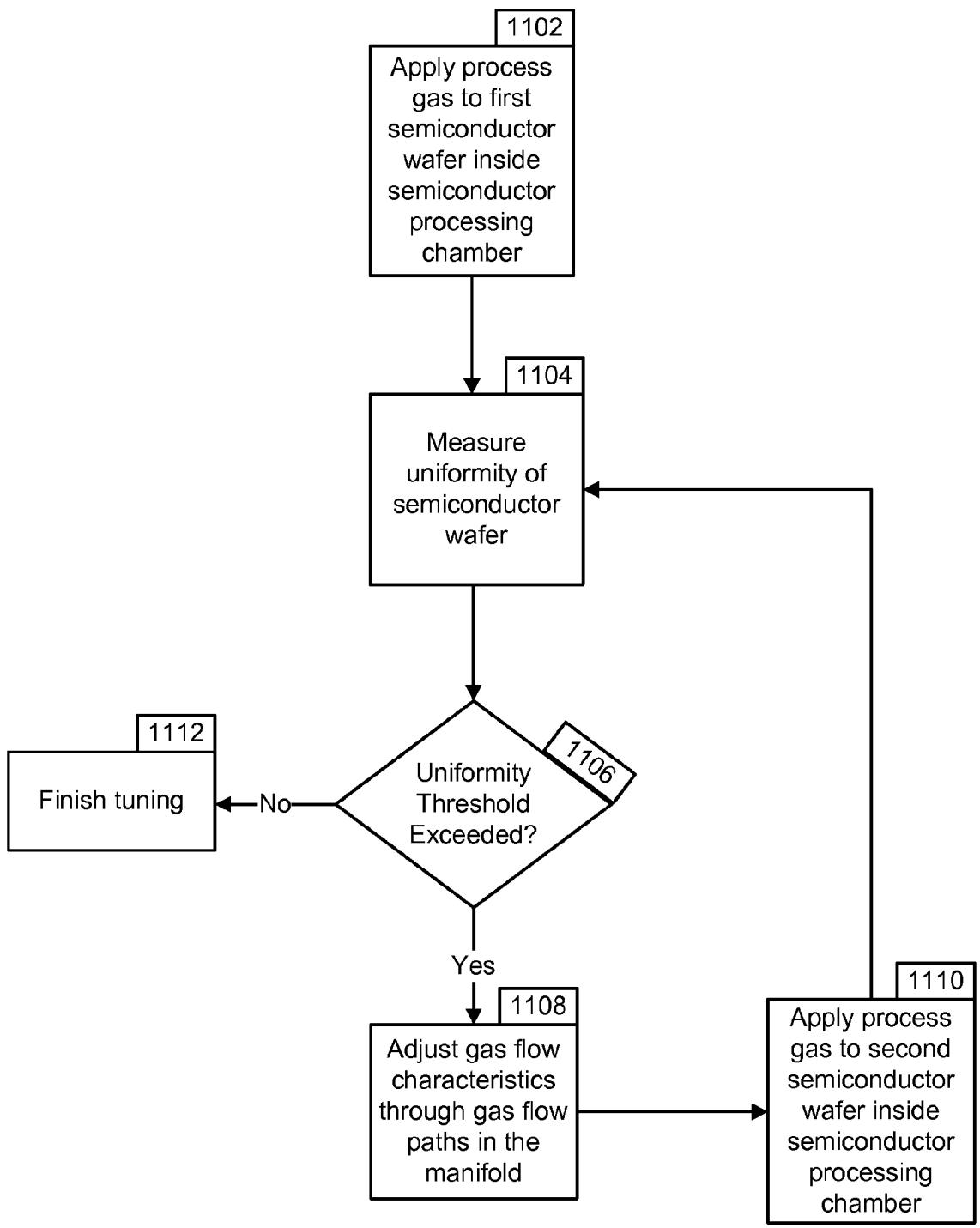
FIG. 11 shows a flow diagram detailing an additional example of tuning on-wafer uniformity with a gas flow manifold.

FIG. 11 shows a flow diagram detailing an additional example of tuning on-wafer uniformity with a gas flow manifold.

Block 1102 and 1104 are similar to blocks 1002 and 1004 in FIG. 10. In block 1106, a determination may be made of whether the uniformity of the semiconductor wafer exceeds a uniformity threshold. For example, the uniformity of the semiconductor wafer may be expressed in a half range percentage value calculated through the formula:

$$\frac{(\text{maximum wafer thickness} - \text{minimum wafer thickness})}{2 * \text{average wafer thickness}}$$

The half range percentage value of the semiconductor wafer processed in block 1102 may then be compared to a threshold half range percentage value. For example, the threshold half range percentage value may be a half range percentage between 0.01-2.5%, such as 0.5% or 1%. Other implementations may have different threshold half range percentage values. If the half range percentage value of the semiconductor exceeds the threshold half range percentage value, then the uniformity threshold is exceeded.

Other methods of comparing the uniformity of the semiconductor wafer with a uniformity threshold, such as sigma values (standard deviation/average) or beta uniformity, may also be used.

If, in block 1106, a determination is made that the uniformity of the semiconductor wafer does not exceed the uniformity threshold, then no further adjustment is necessary, as detailed in block 1112. If, in block 1106, a determination is made that the uniformity of the semiconductor wafer exceeds the uniformity threshold, then the gas flow characteristics through the manifold gas flow paths are adjusted, as detailed in block 1108. The adjustment of the manifold gas flow paths in block 1108 is similar to that in block 1006 of FIG. 10.

After the adjustment of the manifold gas flow paths in block 1108, process gas is applied to a second semiconductor wafer inside the semiconductor processing chamber. Process gas is delivered in a manner similar to that of block 1102 through the gas flow manifold, with the gas flow characteristics of the gas flow manifold adjusted as in block 1108.

After process gas is applied to the second semiconductor wafer in block 1108, the uniformity of the second semiconductor wafer is measured in block 1104. After the uniformity of the second semiconductor wafer is measured in block 1104, a determination is then made as to whether the uniformity of the second semiconductor wafer exceeds the uniformity threshold. If the uniformity threshold is not exceeded, then no further adjustment is necessary. If the uniformity threshold is exceeded, then the gas flow path characteristics are further adjusted.

Figure 12:
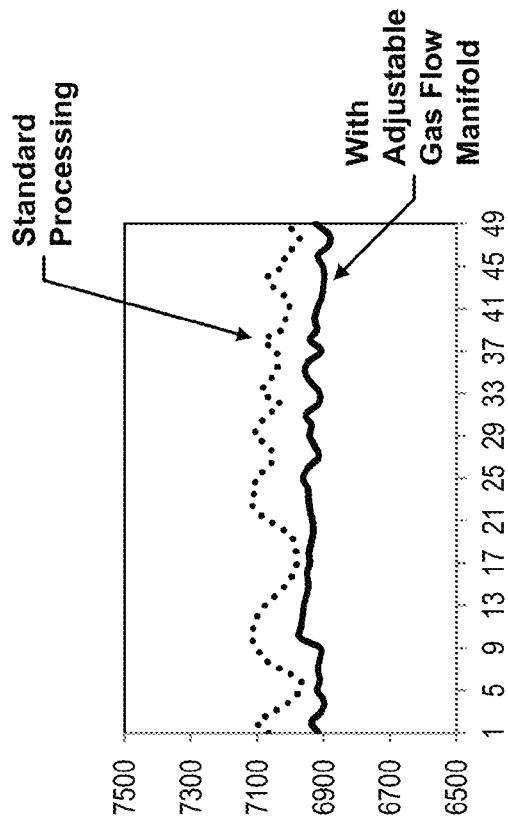
FIG. 12A shows an example result of tuning on-wafer uniformity with a gas flow manifold.
FIG. 12B shows a further example result of tuning on-wafer uniformity with a gas flow manifold.
Figure 12:
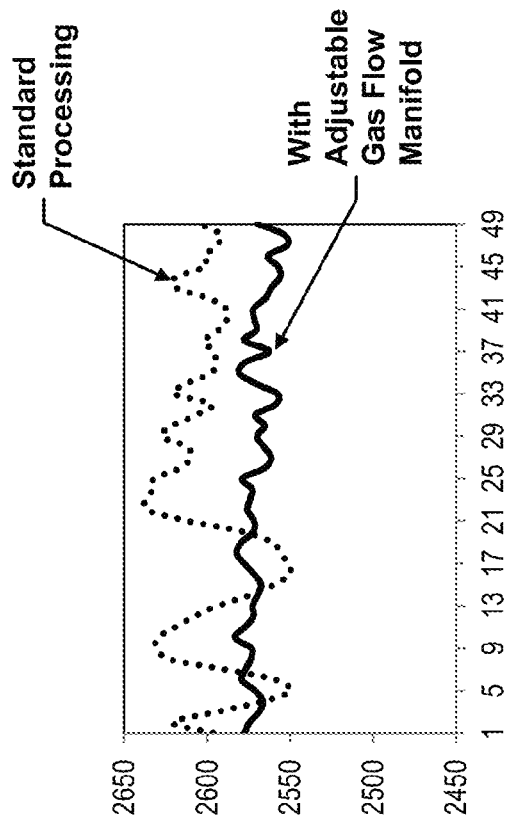

FIG. 12A show an example result of tuning on-wafer uniformity with a gas flow manifold. FIG. 12B shows a further example result of tuning on-wafer uniformity with a gas flow manifold. FIGS. 12A and 12B are example graphs each showing the thicknesses of two semiconductor wafers. In the figures, a solid line corresponds to the thickness of a semiconductor wafer processed with an adjustable gas flow manifold while a dotted line corresponds to the thickness of a semiconductor wafer processed without the adjustable gas flow manifold. In FIGS. 12A and 12B, the y-axes of the graphs correspond to thicknesses of the processed semiconductor wafers while the x-axes of the graphs correspond to 49 measurement points of the semiconductor wafers.

As shown in both FIGS. 12A and 12B, the thicknesses of the semiconductor wafers processed with the adjustable gas flow manifold (the solid line) are more uniform than the thicknesses of the semiconductor wafers processed without the adjustable gas flow manifold (the dotted line). Compared to the dotted lines, the solid lines have lower variances between maximum and minimum thickness. Thus, the solid lines show better wafer uniformity than the dotted lines. In FIG. 12A, the dotted line has both a greater maximum wafer thickness and a lower minimum wafer thickness than the solid line.

What is claimed is:

1. A semiconductor processing tool gas flow manifold, the gas flow manifold comprising:
    a manifold body; and
    a plurality of manifold gas flow paths extending from a first side of the manifold body to a second side of the manifold body, wherein:
        the manifold body is adapted for installation in a semiconductor processing tool such that gas flows through the manifold body from the first side to the second side, and
        the manifold gas flow paths are individually adjustable from the first side of the manifold body to alter gas flow characteristics through the manifold body by the insertion of an orifice into a corresponding one of the manifold gas flow paths, the orifice comprising,
            an orifice body, and
            a hole in the orifice body allowing for process gas flow through the hole.

2. The gas flow manifold of claim 1, wherein the manifold gas flow paths are internal to the manifold body.

3. The gas flow manifold of claim 1, wherein there are four manifold gas flow paths.

4. The gas flow manifold of claim 1, further comprising a showerhead, wherein the showerhead includes:
    a showerhead body; and
    a showerhead faceplate including a plurality of showerhead holes, wherein each showerhead hole is fluidically connected with a manifold gas flow path.

5. The gas flow manifold of claim 1, wherein the manifold body is made of aluminum.

6. The gas flow manifold of claim 1, wherein the gas flow characteristics are altered by the removal of a first orifice from within a manifold gas flow path and the insertion of a second orifice into the manifold gas flow path.

7. The gas flow manifold of claim 6, wherein the hole of the first orifice allows a maximum gas flow rate different from the maximum gas flow rate allowed by the hole of the second orifice.

8. The gas flow manifold of claim 1, further comprising an injector, wherein the injector includes:
    an injector body; and
    a plurality of injector gas flow paths extending from a first side of the injector body to a second side of the injector body such that each injector gas flow path is fluidically connected with a corresponding manifold gas flow path.

9. The gas flow manifold of claim 8, each injector gas flow path comprising:
    an inlet; and
    an outlet, wherein the inlet and the outlet are fluidically connected and the inlet and the outlet form an angle between 30 and 60 degrees.

10. A semiconductor wafer processing tool, comprising:
a semiconductor wafer processing chamber, the semiconductor wafer processing chamber including a vacuum sealable chamber interior;
a semiconductor processing tool gas flow manifold outside the vacuum sealable chamber interior, the gas flow manifold including:
a manifold body, and
a plurality of manifold gas flow paths extending from a first side of the manifold body to a second side of the manifold body, wherein:
the manifold body is installed in the semiconductor processing tool such that gas flows through the manifold body from the first side to the second side,
the manifold gas flow paths are individually adjustable from outside the vacuum sealable chamber interior to alter gas flow characteristics through the manifold body by the insertion of an orifice into a corresponding one of the manifold gas flow paths, the orifice comprising,
an orifice body, and
a hole in the orifice body allowing for process gas flow through the hole and
a process gas dispersion device, including:
a first side of the gas dispersion device, wherein the first side of the gas dispersion device is fluidically connected with the gas flow paths exiting the second side of the manifold body, and
a second side of the gas dispersion device, wherein the second side of the gas dispersion device is inside the vacuum sealable chamber interior and comprises features for emission of process gas into the vacuum sealable chamber interior.

11. The semiconductor wafer processing tool of claim 10, further comprising a process gas intake, the process gas intake including:
an intake body;
an intake inlet, wherein the intake inlet receives process gas; and
a plenum, the plenum fluidically connected to the intake inlet and the manifold gas flow paths, wherein the plenum comprises features for providing process gas to the manifold gas flow paths.

12. The semiconductor wafer processing tool of claim 10, wherein the features for emission of process gas include the exit of a plurality of gas flow paths from the first side of the process gas dispersion device to the second side of the process gas dispersion device.

13. The semiconductor wafer processing tool of claim 10, wherein the second side of the process gas dispersion device is a showerhead faceplate and the features for emission of process gas include a plurality of showerhead holes in the showerhead faceplate.

14. The semiconductor wafer processing tool of claim 10, further including a plurality of side injectors, wherein the side injectors are inside the vacuum sealable chamber interior and include features for emission of process gas into the vacuum sealable chamber interior.

15. The semiconductor wafer processing tool of claim 10, further comprising a process gas source, wherein the process gas source is fluidically connected to the plurality of manifold gas flow paths and includes features for providing process gas to the manifold gas flow paths.

16. The semiconductor wafer processing tool of claim 15, further comprising a controller with one or more processors and a memory, wherein the one or more processors, the memory, and the process gas source are communicatively coupled, and the memory stores instructions for controlling the one or more processors to cause the process gas source to provide process gas to the manifold gas flow paths.

17. The semiconductor wafer processing tool of claim 16, further including a plurality of side injectors, wherein:
the side injectors are fluidically connected to the process gas source;
the side injectors are inside the vacuum sealable chamber interior;
the side injectors include features for emission of process gas into the vacuum sealable chamber interior; and
the memory stores instructions for controlling the one or more processors to cause the process gas source to provide process gas to the side injectors.

18. The semiconductor wafer processing tool of claim 10, wherein:
the vacuum sealable chamber interior includes features for supporting a semiconductor wafer, the semiconductor wafer including a plurality of wafer regions; and
the second side of the process gas dispersion device includes features for emission of process gas from a plurality of dispersion regions, wherein the process gas from each dispersion region is targeted at a wafer region.

19. The semiconductor wafer processing tool of claim 18, wherein each manifold gas flow path supplies process gas to one dispersion region.

20. A method for tuning on-wafer uniformity in semiconductor wafer processing, the method comprising:
a) applying process gas to a semiconductor wafer inside a semiconductor processing chamber, wherein process gas enters the semiconductor processing chamber through a plurality of gas flow paths extending from a first side of a manifold body to a second side of the manifold body, wherein the first side of the manifold body is outside the semiconductor processing chamber, and gas flows through the manifold body from the first side to the second side;
b) measuring the uniformity of the semiconductor wafer; and
c) adjusting, from the first side of the manifold body, the gas flow characteristics through at least one of the gas flow paths in the manifold body by the insertion an orifice into a corresponding one of the manifold gas flow paths, the orifice comprising:
an orifice body, and
a hole in the orifice body allowing for process gas flow through the hole.

21. The method of claim 20, further comprising:
e) applying process gas to a second semiconductor wafer inside the semiconductor processing chamber, after c).

22. The method of claim 20, wherein:
the gas flow characteristic is adjusted by removing the orifice from within the manifold gas flow path and inserting a second orifice having a different hole size into the manifold gas flow path.

23. The method of claim 20, further comprising:
d) determining whether the uniformity of the semiconductor wafer exceeds a uniformity threshold.

24. The method of claim 23, wherein the uniformity threshold is a half range percentage of less than 1%.

* * * * *